(12) United States Patent
Kathrein et al.

(10) Patent No.: US 7,521,132 B2
(45) Date of Patent: Apr. 21, 2009

(54) COATED TOOL

(75) Inventors: Martin Kathrein, Reutte (AT); Claude Michotte, Arlon (BE); Peter Polcik, Reutte (AT)

(73) Assignee: Ceratizit Austria Gesellschaft m.b.H., Reutte (AU)

( * ) Notice: Subject to any disclaimer, the term of this patent is extended or adjusted under 35 U.S.C. 154(b) by 236 days.

(21) Appl. No.: 11/415,050

(22) Filed: May 1, 2006

(65) Prior Publication Data

US 2006/0246320 A1  Nov. 2, 2006

(30) Foreign Application Priority Data

Apr. 29, 2005  (AT) ............................. GM286/2005

(51) Int. Cl.
*B23B 27/14* (2006.01)

(52) U.S. Cl. ........................ 428/699; 51/307; 51/309; 204/298.12; 204/298.13; 428/216; 428/472; 428/697; 428/698

(58) Field of Classification Search ................. 51/307, 51/309; 428/216, 469, 472, 697, 698, 699, 428/701, 702, 704, 408; 204/298.12, 298.13
See application file for complete search history.

(56) References Cited

U.S. PATENT DOCUMENTS

| | | | |
|---|---|---|---|
| 6,103,357 A | 8/2000 | Selinder et al. | |
| 6,113,752 A | 9/2000 | Hollstein | |
| 6,726,987 B2 | 4/2004 | Kathrein et al. | |
| 6,736,784 B1 | 5/2004 | Menne et al. | |
| 6,767,658 B2 * | 7/2004 | Yamamoto et al. | 428/698 |
| 6,811,581 B2 | 11/2004 | Yamada et al. | |
| 7,211,138 B2 * | 5/2007 | Yamamoto et al. | 428/699 |
| 2003/0124363 A1 | 7/2003 | Kathrein et al. | |
| 2003/0148145 A1 | 8/2003 | Yamamoto et al. | |
| 2004/0163018 A1 | 8/2004 | Yoshida | |
| 2005/0115742 A1 | 6/2005 | Daub et al. | |

FOREIGN PATENT DOCUMENTS

| | | |
|---|---|---|
| DE | 102 33 222 A1 | 2/2003 |
| DE | 102 13 963 A1 | 10/2003 |
| EP | 0 558 061 A1 | 9/1996 |
| EP | 1 018 387 B1 | 7/2000 |
| EP | 1 201 776 A2 | 5/2002 |
| EP | 1 231 295 A2 | 8/2002 |
| EP | 1 452 621 A3 | 9/2004 |
| JP | 64-22244 | 1/1989 |
| JP | 2003-34859 | 2/2003 |
| JP | 2004-042170 | 2/2004 |
| JP | 2004-122244 | 4/2004 |
| WO | WO 98/48072 | 10/1998 |
| WO | WO 01/00094 A1 | 1/2001 |
| WO | WO 2004/059030 A2 | 7/2004 |

OTHER PUBLICATIONS

"Deposition and characterisation of TiAlBN coatings produced by direct electron-beam evaporation of Ti and Ti-Al-B-N material from a twin crucible source" (Rebholz, et al.), dated 1999, Thin Solid Films, pp. 242-245.

"Present and possible future application of superhard nanocomposite coatings" (Holubar, et al.), dated 2000, Surface Coatings & Technology, pp. 145-151.

* cited by examiner

*Primary Examiner*—Archene Turner
(74) *Attorney, Agent, or Firm*—Laurence A. Greenberg; Werner H. Stemer; Ralph E. Locher

(57) ABSTRACT

A tool consists of a base material selected from cemented carbide, tool steels, cermet, or hard materials, and a coating of two or more layers. At least one coating layer has the composition Ti—Al—Ta—N and at least one further coating layer has the composition Ti—Al—Ta-Me-N. The component Me is one more elements selected from the group consisting of Si, V, B. The tool, which is preferably a wearing part, is distinguished by a high wear resistance that improves the service life, in particular where high demands are imposed on the tool.

24 Claims, No Drawings

COATED TOOL

BACKGROUND OF THE INVENTION

1. Field of the Invention

The invention relates to a tool consisting of a base material selected from the group consisting of cemented carbide, cermet, hard material and tool steel and a coating comprising two or more layers with a total coating thickness of from 0.5 µm to 15 µm, a coating layer having a thickness of from 0.0003-5.0 µm.

Cemented carbides, cermets, hard materials and tool steels are used for tools which are exposed to high wearing stresses. The term cemented carbide is to be understood as meaning a composite material which is composed of a hard material phase and a metallic binder. The cermet group of materials comprises all materials which are composed of one or more ceramic phases and one or more metallic phases. Hard materials encompass all materials with a hardness of >1000 HV. These include compounds of elements from group IVa to VIa of the periodic system with the elements carbon, nitrogen, boron or silicon. However, this group of materials also encompasses diamond, cubic boron nitride, silicon carbide, sialons, aluminum oxide, aluminum nitride and silicon nitride, to mention just the most important. Tool steels in accordance with DIN 17 300 are steels defined by their use in tools.

To increase the resistance to wear, wear-resistant hard material coatings based on carbides, nitrides, borides, silicides and oxides are applied to the base material. These coatings may comprise one or more coating layers and have hardnesses which are usually in the range from 1500 HV to 4000 HV. By way of example, reference may be made to single-layer or multilayer coatings consisting of titanium nitride, titanium carbon nitride, titanium aluminum nitride or aluminum oxide.

Under load, the tribological system, in addition to the tool, also comprises opposing bodies which cause the wear and friction, possibly intervening materials, the forces which are active, the sequence of movements and the environmental influences. In particular if the forces which are active and the relative velocity between tool and opposing body are high, a considerable temperature rise occurs in the superficial boundary region between the wearing part and the opposing body. For example, temperatures of 1000° C. and in some cases even above are measured at the surface of a machining tool. The causes of this are deformation and separation work in the shearing zone, friction of the chip at the primary face and friction of the work piece at the flank.

Hard-material coatings based on TiAlN are in widespread use for improving the wearing properties of tools. The influence of different Al contents on the improvement to the abrasion and oxidation resistance and the influence of further elements on the abrasion resistance of titanium nitride coatings, in particular produced using PVD processes, have been investigated.

For example, *Thin Solid Films*, 343 (1999), pp. 242-145 has described TiAlBN layers which have been produced in an Ar plasma at 450° C. However, it was not possible to achieve any significant improvements to the wear resistance during dry machining.

*Surface Coat. Technol.*, 133-134 (2000) pp. 145-151 has disclosed TiAlSiN coatings produced by means of cathode arc vaporization and containing from 3.8 at. % to 8.2 at. % Si, wherein case hardness values from 35 to 45 GPa were achieved.

Furthermore, in a TiAlN coating it is also possible for Ti to be substituted by Cr, Hf, Zr or Nb.

For example, international PCT publication WO 2004/059030 describes an AlCrN coating with improved wear properties.

European patent publication EP 0 558 061 describes the partial or complete substitution of the Ti in the titanium nitride by the elements Hf, Zr, Cr or Nb, hard-material coatings of this type being joined to the base material via a metallic interlayer of Nb or Ta.

Japanese patent publication JP 2003-034859 describes a wear-resistant MeAlCrVCN coating, wherein at least one of the elements Ti, Nb, W, Ta or Mo is used for Me.

European patent publication EP 1 201 776 describes a gear-cutting tool made from high-speed steel with a multilayer coating combination comprising TiAlTaN or TiAlTaCN and TiAlN or TiAlCN, which is used for the machining of low-alloy steels or soft steels. The combination of the two layers results in a high service life combined with a low susceptibility to chip sticking.

In the event of high tool stresses, as occur for example in the dry milling of alloyed steels, very high surface temperatures are reached in the tool contact zones, such as for example the primary face and flank. Similarly high stresses also occur, for example, in the entry region of a shaping tool. The wear resistance of the known coating systems described above has hitherto been unsatisfactory in these applications, in particular if coolants are not used.

SUMMARY OF THE INVENTION

It is accordingly an object of the invention to provide a coated tool, which overcomes the above-mentioned disadvantages of the heretofore-known devices and methods of this general type and which provides for a tool with a high wear resistance under high thermal stresses, with the coefficient of friction in contact with the wearing body being as low as possible.

With the foregoing and other objects in view there is provided, in accordance with the invention, a tool, comprising:

a base material selected from the group consisting of cemented carbide, cermet, hard material, and tool steel;

a coating formed of two or more coating layers and having a total coating thickness of from 0.5 µm to 15 µm, a coating layer having a thickness from 0.0003 to 5.0 µm;

at least one of said coating layers having a composition $(Ti_aAl_bTa_c)N$, where:

$a+b+c=1$;

$0.3 \leq b \leq 0.75$;

$0.001 \leq c \leq 0.30$;

at least one of said coating layers having a composition $(Ti_dAl_eTa_fM_g)N$, where:

$d+e+f+g=1$;

$0.50 \leq e \leq 0.70$;

$0 \leq f \leq 0.25$;

and M is one or more elements selected from the group consisting of Si, V, B, with:

for Si: $0.0005 \leq g \leq 0.10$;

for V: $0.001 \leq g \leq 0.25$ and for B: $0.00005 \leq g \leq 0.01$.

In other words, the coating according to the invention comprises at least two coating layers. A first coating layer in this case has a composition of $(Ti_aAl_bTa_c)N$, where a+b+c=1, $0.3 \leq b \leq 0.75$ and $0.001 \leq c \leq 0.30$. In the following text, this coating layer is referred to as "A."

The second coating layer has a composition $(Ti_d Al_e Ta_f M_g)$ N, with $d+e+f+g=1$, $0.50 \leq e \leq 0.70$ and $0 \leq f \leq 0.25$. M denotes one or more elements selected from the group consisting of silicon, vanadium, and boron, the silicon content being between 0.05 At. % and 10 At. %, the vanadium content being between 0.1 At. % and 25 At. % and the boron content being between 0.005 At. % and 1 At. %. In the following text, this coating layer is referred to as "B."

The addition of tantalum to the alloy in coating layer A results in a considerable increase in the hot hardness. It has been found that tantalum stabilizes the face-centered cubic solid solution up to very high temperatures of approximately 800° C. Although phase decomposition does occur at higher temperatures, leading to the precipitation of cubic aluminum nitride domains, this precipitation results in a further increase in hardness of approx. 10% at temperatures of approximately 900° C. Even at a temperature of 1100° C., following annealing tests in vacuo, hardness values in the range of the coating hardness of the starting state were still measured. Tantalum as a constituent of coating layer A therefore increases the hot hardness in a temperature range which, in particular in the case of uncooled shaping processes, occurs in the contact zone between the coated surface and the wearing body. The addition of tantalum to the alloy therefore leads, in the relevant temperature range from 700° C. to 1100° C., to optimum protection from abrasive wear, this being achieved in a self-adaptive fashion. However, tantalum in TiAlN causes an increase in the coefficient of friction at temperatures of 700° C. and above. This was detected both against an inert aluminum oxide ball and against an austenitic steel. Furthermore, the ductility of the coating layer A is insufficient for many applications; in this context, mentioned may be made, for example, of milling operations and high-speed cutting. Coating layer B contains at least one element selected from the group consisting of silicon, vanadium and boron. Silicon, vanadium and boron have a friction-reducing effect at high temperatures. Moreover, coating layer B preferably contains less tantalum than coating layer A, with the result that coating layer B is more ductile than coating layer A. The ductility of the microstructure can be set using a sequence of coating layer A and coating layer B; it can be favorably influenced in such a manner that, for example in the case of milling operations, sufficient coating stability against flaking is ensured. The wear resistance can be set both by means of the tantalum content and by means of the Ti/Al ratio. In this context, it has emerged that the Al content can be set from 30 At. % to 75 At. %, depending on the tantalum content of from 0.1 At. % to 30 At. %. In coating layer B, the Ti/Al ratio can likewise be selected in a wide range, in accordance with the details given in claim 1, as a function of the tantalum content, which is in the range from 0 At. % to 25 At. %. A preferred range for aluminum in coating layer A is 45 At. % to 66 At. %. Tantalum contents of less than 0.1 At. % do not sufficiently increase the hardness. Ta contents of over 30 At. % lead to excessive embrittlement of the coating layer A. A preferred range for tantalum in coating layer A is from 1 At. % to 25 At. %. Correspondingly lower tantalum contents can be selected in the more ductile coating layer B, wherein contents of from 0 At. % to 25 At. %, preferably 0.2 At. % to 10 At. %, are used. Silicon in coating layer B has a favorable effect on the resistance to oxidation. In order to achieve a sufficient effect in this respect, silicon contents of 0.1 At. % are advantageous. If the silicon content is over 10 At. %, the embrittlement is unacceptably high for many applications. The preferred upper limit is 3 At. %. It has been found that these favorable silicon contents of from 0.1 At. % to 3 At. % sufficiently reduce the friction between the tool and the opposing body. Vanadium produces much less increase in strength than silicon and therefore also does not increase the fracture toughness of the layer to such a great extent. The vanadium contents can therefore be selected to be higher than the silicon contents in coating layer B.

Extensive tests have demonstrated that an optimum vanadium content is from 0.1 At. % to 25 At. %, preferably from 2 At. % to 20 At. %. Vanadium has a considerable friction-reducing effect, attributable to the formation of Magneli phases. The preferred range for boron in coating layer B is from 0.001 At. % to 0.5 At. %. Boron increases the oxidation resistance of the coating by reducing the diffusion rate for further elements. Boron contents of over 1 At. % reduce the hardness, which is attributable to the formation of hexagonal phase constituents. By using multilayer coatings, it is possible to ideally set the microstructure of the coating and therefore also the fracture toughness. The number of coating layers may be in the range from approx. 10 up to 10 000 or more layers. A periodically alternating sequence of the individual coating layers can be produced more easily in terms of the equipment required. In the case of two different coating layers, this therefore results in the sequence A, B, A, B, A, B . . . .

If a third coating layer C is used, the result is a coating sequence A, B, C, A, B, C, A, B, C . . . .

The corresponding sequences are similar in the case of four or more coating layers of different compositions. Coating layers of different compositions also have different nucleation rates or different nucleation growth rates. Therefore, the individual coating layers typically also have different thicknesses. An optimum fracture toughness/hardness ratio can be set if the individual coating layers predominantly have a cubic structure, since the cubic phase is a significantly more wear-resistant structure than the hexagonal phase. Small proportions of, for example, radiologically amorphous microstructural constituents which are arranged between the cubic constituents increase the fracture toughness of the layer. To improve the coating bonding, it is advantageous for the coating layer which is in contact with the base material to consist of titanium nitride.

The most favorable combination of coating and base material is achieved if cemented carbide is used as the base material.

Excellent service lives can be achieved if the coated tool is used as a cutting tool. A typical use as a cutting tool in this context is solid cemented carbide milling tools and disposable cutting tool tips. However, the advantages of the invention can also be realized in shaping tools.

Various coating processes can be used to apply the coating. One favorable procedure is the PVD process in arc vaporization or sputtering mode, using single-component or multi-component targets. The targets used to produce coating layer A in this case have an aluminum content of from 30 At. % to 75 At. % and a tantalum content of from 0.1 At. % to 30 At. %, with the remainder consisting of titanium.

Targets used to produce coating layer B consist of 50 At. % to 70 At. % aluminum, 0 to 25 At. % tantalum and at least one element selected from the group consisting of silicon, vanadium, boron, remainder titanium; in the case of silicon, the content is from 0.05 At. % to 10 At. %, in the case of vanadium the content is from 0.1 At. % to 25 At. %, and in the case of boron the content is from 0.005 At. % to 1 At. %.

As an alternative to PVD processes, it is also possible to use various CVD processes to implement the present invention. By way of example, the coating according to the invention can be produced by plasma-enhanced CVD processes or CVD processes using metalorganic precursors (MOCVD).

Other features which are considered as characteristic for the invention are set forth in the appended claims.

Although the invention is illustrated and described herein as embodied in a coated tool, it is nevertheless not intended to be limited to the details shown, since various modifications and structural changes may be made therein without departing from the spirit of the invention and within the scope and range of equivalents of the claims.

The implementation of the invention, however, together with additional objects and advantages thereof will be best understood from the following description of the specific embodiments in the examples.

DESCRIPTION OF THE PREFERRED EMBODIMENTS

Two-layer TiAlTaN/TiAlTaMeN coatings were applied to disposable cutting tool tips made from cemented carbide with a conventional industrial PVD installation with arc vaporization of targets produced by powder metallurgy in a $N_2$—Ar atmosphere. The alloying element contents in the layer in this process, taking account of the procedure adopted, are well matched to the contents of the elements in the targets used. Tables 1-5 give the compositions of the targets used for the coating production process. Four sources or target positions were used. In each case two opposite, vertically offset positions comprising targets of the same composition were used.

For the purpose of comparison, an identical coating program was also used for the production of reference specimens corresponding to the prior art. The specimen installation and the occupancy of the process chamber were selected to be identical for all the specimens.

For comparative service life tests, the following parameters were used:

Disposable cutting tool tip: SEKN 1203AF SN made from S40T
Machined material: 42CrMo4
Machining conditions: Dry machining
Machining parameters: $v_c$=230 m/min, f=0.30 mm/rev, $a_p$=2.0 mm, $a_e$=96 mm.

Example 1

Example 1 uses a four-layer coating comprising a periodically alternating sequence of coating 1 and 2 (specimen B 2a) and coating 1b and 2 (specimen B 2b) to show the influence of the variation in the tantalum content with a constant Al/Ti ratio (Al/Ti=2) in the first coating layer (1a, 1b) and in each case a constant composition in the second coating layer (cf. Table 1).

TABLE 1

|  |  |  |  | Ti [At. %]* | Al [At. %]* | Ta [At. %]* | V [At. %]* |
|---|---|---|---|---|---|---|---|
| Reference specimen | Prior art | Single-layer coating | TiAlN | 50 | 50 |  |  |
| B 2a | Invention | Coating layer 1a | TiAlTaN | 33.00 | 66.00 | 1.00 |  |
|  |  | Coating layer 2 | TiAlTaVN | 49.80 | 49.80 | 0.20 | 0.20 |
| B 2b | Invention | Coating layer 1b | TiAlTaN | 31.50 | 63.50 | 5.00 |  |
|  |  | Coating layer 2 | TiAlTaVN | 49.80 | 49.80 | 0.20 | 0.20 |

(*based on the metallic fraction)

The improvement in service life using coating B 2a compared to the reference specimen is 78%. With coating B 2b it was possible to double the service life.

Example 2

Example 2 uses a four-layer coating comprising a periodically alternating sequence of coating 1b and 2 (specimen B 3a) or coating 1c and 2 (specimen B 2b) to show the influence of the Al/Ti ratio (Al/Ti=1.5; Al/Ti=2) with a constant tantalum content in the first coating layer and in each case the same composition in the second coating layer (cf. Table 2).

TABLE 2

|  |  |  |  | Ti [At. %]* | Al [At. %]* | Ta [At. %]* | V [At. %]* |
|---|---|---|---|---|---|---|---|
| Reference specimen | Prior art | Single-layer coating | TiAlN | 50 | 50 |  |  |
| B 3a | Invention | Coating layer 1b | TiAlTaN | 38.00 | 57.00 | 5.00 |  |
|  |  | Coating layer 2 | TiAlTaVN | 49.80 | 49.80 | 0.20 | 0.20 |
| B 2b | Invention | Coating layer 1c | TiAlTaN | 31.50 | 63.50 | 5.00 |  |
|  |  | Coating layer 2 | TiAlTaVN | 49.80 | 49.80 | 0.20 | 0.20 |

(*based on the metallic fraction)

It was in this way possible to achieve an improvement in service life compared to the reference specimen with both coating B 3a and B 2b; this improvement is 84% in the case of B 3a. Moreover, these tests show the influence of the Al/Ti ratio with a constant tantalum content.

Example 3

Example 3 shows the influence of boron on the service life properties (cf. Table 3).

TABLE 3

|  |  |  |  | Ti [At. %]* | Al [At. %]* | Ta [At. %]* | B [At. %]* |
|---|---|---|---|---|---|---|---|
| Reference specimen | Prior art | Single-layer coating | TiAlN | 50 | 50 | | |
| B 4 | Invention | Coating layer 1 | TiAlTaN | 49.50 | 49.50 | 1.00 | |
|  |  | Coating layer 2 | TiAlTaBN | 32.83 | 65.67 | 1.00 | 0.50 |

(*based on the metallic fraction)

The improvement in service life using coating B 4 compared to the reference specimen is 42%.

Example 4

Example 4 shows the influence of silicon on the service life properties (cf. Table 4).

TABLE 4

|  |  |  |  | Ti [At. %]* | Al [At. %]* | Ta [At. %]* | Si [At. %]* |
|---|---|---|---|---|---|---|---|
| Reference specimen | Prior art | Single-layer coating | TiAlN | 50 | 50 | | |
| B 5 | Invention | Coating layer 1 | TiAlTaN | 49.50 | 49.50 | 1.00 | |
|  |  | Coating layer 2 | TiAlTaSiN | 38.00 | 55.00 | 5.00 | 2.00 |

(*based on the metallic fraction)

The improvement in service life using coating B 5 compared to the reference specimen is 91%.

Example 5

Example 5 shows the influence of vanadium on the service life properties (cf. Table 5).

TABLE 5

|  |  |  |  | Ti [At. %]* | Al [At. %]* | Ta [At. %]* | V [At. %]* |
|---|---|---|---|---|---|---|---|
| Reference specimen | Prior art | Single-layer coating | TiAlN | 50 | 50 | | |
| B 6 | Invention | Coating layer 1 | TiAlTaN | 49.50 | 49.50 | 1.00 | |
|  |  | Coating layer 2 | TiAlTaVN | 16.50 | 66.00 | 1.00 | 16.50 |

(*based on the metallic fraction)

The improvement in service life using coating B 6 compared to the reference specimen is 250%.

This application claims the benefit, under 35 U.S.C. §119, of Austrian patent application GM 286/2005 (Gebrauchsmuster), filed Apr. 29, 2005, which is herewith incorporated by reference in its entirety.

We claim:

1. A tool, comprising:
   a base material selected from the group consisting of cemented carbide, cermet, hard material, and tool steel;
   a coating formed of two or more coating layers and having a total coating thickness of from 0.5 μm to 15 μm, a coating layer having a thickness from 0.0003 to 5.0 μm;
   at least one of said coating layers having a composition $(Ti_aAl_bTa_c)N$, where:

$a+b+c=1;$ $0.3 \leq b \leq 0.75;$ $0.001 \leq c \leq 0.30;$ and at least one of said coating layers having a composition $(Ti_dAl_eTa_fM_g)N$, where:

$d+e+f+g=1;$ $0.50 \leq e \leq 0.70;$ $0 \leq f \leq 0.25;$ and M is one or more elements selected from the group consisting of Si, V, B, with:

for Si: $0.0005 \leq g \leq 0.10;$ for V: $0.001 \leq g \leq 0.25$ and for B: $0.00005 \leq g \leq 0.01.$ 2. The tool according to claim 1, wherein f<c.
3. The tool according to claim 1, wherein $0.01 \leq c \leq 0.25$.
4. The tool according to claim 1, wherein $0.001 \leq f \leq 0.20$.
5. The tool according to claim 4, wherein $0.002 \leq f \leq 0.10$.
6. The tool according to claim 1, wherein M is silicon, and $0.001 \leq g \leq 0.03$.
7. The tool according to claim 1, wherein M is vanadium, and $0.10 \leq g \leq 0.20$.
8. The tool according to claim 1, wherein M is boron, and $0.0001 \leq g \leq 0.005$.
9. The tool according to claim 1, wherein said coating is formed with coating layers of periodically alternating, different compositions.
10. The tool according to claim 1, wherein said coating layers have mutually different thicknesses.
11. The tool according to claim 1, wherein said coating layers have a predominantly cubic structure.
12. The tool according to claim 11, wherein small quantities of radiologically amorphous microstructural constituents are present in said coating.
13. The tool according to claim 1, wherein said coating has a first coating layer in contact with said base material, and said first coating layer is formed of titanium nitride.
14. The tool according to claim 1, wherein said coating has a top layer contains C as a friction-reducing constituent.
15. The tool according to claim 1, wherein said coating has a metallic top layer.
16. The tool according to claim 1, wherein said coating has an oxidic top layer.
17. The tool according to claim 1, wherein said base material is cemented carbide.
18. The tool according to claim 1, wherein the tool is a cutting tool.
19. The tool according to claim 18, wherein the cutting tool is a disposable cutting tool tip.
20. The tool according to claim 1, wherein the tool is a shaping tool.
21. The tool according to claim 1, wherein said coating is a CVD process coating.
22. The tool according to claim 1, wherein said coating is a PVD process.
23. A sputtering target for coating the tool according to claim 1 in a PVD process, the sputtering target consisting of:

30 At. % to 75 At. % Al;

0.1 At. % to 30 At. % Ta; and remainder Ti.

24. A sputtering target for coating the tool according to claim 1, in a PVD process, the sputtering target consisting of:

50 At. % to 70 At. % Al;

0 At. % to 25 At. % Ta;

at least one element selected from the group consisting of Si, V, B;
    remainder Ti; and
    wherein,
       if Si is selected, the Si content is from 0.05 At. % to 10 At. %;
       if V is selected, the V content is from 0.1 At. % to 25 At. %; and
       if B is selected, the B content is from 0.005 At. % to 1 At. %.

* * * * *